United States Patent [19]
Mo

[11] Patent Number: 6,115,271
[45] Date of Patent: Sep. 5, 2000

[54] SWITCHING POWER CONVERTERS WITH IMPROVED LOSSLESS SNUBBER NETWORKS

[76] Inventor: Chan Ho Simon Mo, Flat C, 7/F, Block 7, Classical Garden, 8 Ma Wo Road, Tai Po, The Hong Kong Special Administrative Region of the People's Republic of China

[21] Appl. No.: 09/411,645

[22] Filed: Oct. 4, 1999

[51] Int. Cl.[7] .......................... H02H 7/122; H02M 3/335
[52] U.S. Cl. ................................. 363/56; 363/21
[58] Field of Search ................... 363/20, 21, 50, 363/55, 56, 97, 131; 323/222

[56] References Cited

U.S. PATENT DOCUMENTS

| | | | |
|---|---|---|---|
| 5,260,607 | 11/1993 | Kinbara | 363/56 |
| 5,633,579 | 5/1997 | Kim | 323/222 |
| 5,815,386 | 9/1998 | Gordon | 363/50 |

*Primary Examiner*—Matthew Nguyen
*Attorney, Agent, or Firm*—Jacobson, Price, Holman & Stern, PLLC

[57] ABSTRACT

Novel four-terminal lossless snubber networks for use in switching power converters is described. This network is formed by a first series connection of a capacitor and a diode, a second series connection comprising a capacitor and a sub-series connection of an inductor and a diode and a third diode. The four terminal network is designed to be inserted between the power source and the controllable switch and will reduce the maximum stress to which the controllable switch will be exposed during the switching off of the switch by appropriately selecting the values of the capacitance and inductance. Power converters employing the novel snubber topologies are also presented.

18 Claims, 9 Drawing Sheets

SWITCHING POWER CONVERTERS WITH IMPROVED LOSSLESS SNUBBER NETWORKS

FIELD OF THE INVENTION

The present invention relates to switching power converters and more particularly, to switching power converters with lossless snubber network topologies. This invention also relates to improved snubber networks and network topologies for use in connection with switching power converters.

BACKGROUND OF THE INVENTION AND PRIOR ART

Switching power converters are widely used in computers, telecommunication systems, office automation equipment and electrical systems. Power conversion in switching power converters is usually done by switched mode pulse width modulating (PWM) circuits which typically include a switch controllable by a constant switching frequency and the output power of the power converter is controlled by varying the duty cycle of the switching signal. Such power supply devices are commonly known as pulse width modulation power converters.

In order to provide high power density, it is desirable that PWM power converters operate at high frequencies. However, because of inherent component characteristics such as diode stored charge, diode reverse recovery and device switching losses, the switching frequency of conventional power converters of up to 5 kW rating are usually below 200 kHz. With the application of lossless snubber networks such as zero voltage/current switching circuits to alleviate these problems, switching power converters now commonly operate between 500 kHz to 1 MHz.

Rectifying diodes are indispensable in conventional switching power converters. However, in addition to being a major source of electromagnetic interference (EMI) or radio-frequency interference (RFI), the reverse recovery of a rectifying diode is also a major source of stress to the switching device of a switching power converter. This is because when the controllable frequency switch is switched on (closed), it will cause a conducting diode to cease to conduct. At this point, the current through the diode decreases until the diode no longer conducts. Any charge remaining on the diode is then removed via the closed controllable switch. As the charge is being removed from the diode through the switch, the current flowing through the switch begins to rise and the current includes that from the power source, which is usually a voltage source, and that from the diode. This combined current can be more than twice the current from the voltage source alone. The high combined current, high rates of voltage and current changes when the switch is usually at a potential relatively low compared to the voltage source with one end of the controllable switch usually connected to the low potential point of the voltage source, generates significant EMI or RFI and creates considerable stresses in the switch.

Device switching losses are due to the inherent component characteristics of real switches. For real switching devices, the transitions from "open" to "close" and "close" to "open" are not instantaneous. This introduces a switch power loss represented by $P = i_{switch} \times v_{switch}$.

To overcome these problems, reactive snubber networks have been devised to permit "soft-switching" in the process of power conversion. This means that the controlled switching occurs when there is little or no voltage across the controllable switch and/or when there is little or no current flowing through the controllable switch.

Power converters incorporating reactive snubber networks can be broadly categorized as "zero-voltage-switching" (ZVS) converters in which opening (switch off) and closing (switch on) of the switch occurs with little or no voltage across the switch or "zero-current-switching" (ZCS) converters in which opening (switch off) and closing (switch on) of the switch occurs with little or no current in the switch. Generally, ZCS snubbing is achieved by a purely inductive snubber network while the more commonly known ZVS topology is usually by way of a purely capacitive snubber having an antiparallel diode which is made to conduct shortly before the switch is closed (switch on). An example of this type of ZVS snubber network is described in U.S. Pat. No. 5,351,179 by Tsai, et. al.

A known disadvantage of this commonly known ZVS snubber topology is the requirement of additional circuitry to discharge the capacitor or a resistor to dissipate the energy stored in the capacitor during a part of the switching cycle. In such a case, power dissipation is merely shifted from switching losses to resistor losses. Furthermore, it is also well known that large current spikes may result if the snubber network is not accurately designed.

FIG. 1 is an example of a power converter with a dissipative snubber network. Referring to FIG. 1, when the controllable switch S1 is switched on, the current in the windings W1 of the transformer T1 increases and energy is stored in the transformer. When the controllable switch S1 is switched off (open), the energy stored in the transformer T1 will be released to the output capacitor through the secondary windings W2 of the transformer and the diode D2. The leakage energy stored in the transformer T1 can also be transferred to the capacitor C1 through the windings W1 and diode D1. In order to limit the possible peak voltage across the capacitor C1, a resistor is added in parallel to C1 to dissipate the leakage energy.

To alleviate the problem of power dissipation in the aforementioned dissipative snubber network, lossless snubber networks have been designed for use in soft switching power converters. Lossless snubber network are typically reset by inherent circuit operation and the energy stored in the snubber network during one part of the operating cycle is released for re-circulation during the other part of the cycle. An example of this "lossless" snubber is described in the background section and shown in FIG. 2 of U.S. Pat. No. 5,636,114 in which a switchable resonant circuit is formed across the controllable switch. The switchable resonant circuit is only electrically connected across the controllable switch near the end of the time when the controllable switch is off (open). Because of resonance, the voltage across the controllable switch is reduced to zero at the time when the controllable switch is to be switched on (closed). However, an extra active element and supporting circuitry is required to form the switchable resonant circuit which means increased circuit size, loss and costs.

FIG. 2 of this specification shows another example of a lossless snubber network that is described in U.S. Pat. No. 5,636,114 to Bhagwat et al. The snubber network in this topology comprises three series circuits: a first series circuit comprising the diode D21 and the capacitor C21, a second series circuit comprising a saturable inductor L22, the diode D24 and the Capacitor C22, and a third series circuit comprising the diode D23, inductor L21 and the diode D22. In this configuration, the capacitance of C21 must be large enough to completely discharge C22 in the inherent circuit operation. The operation of this network will be briefly explained below.

When the controllable switch S21 is first switched off, the winding energy and the leakage energy between the windings W1 and W2 will charge up the capacitor C21 with the potential at point A being higher than that at point B. At the same time the capacitor C22 is slowly charged up through the saturable inductor L22 and D24. After a short while, L22 is saturated and the voltage across C22, $V_{C22}$, becomes equal to $V_{C21}$+Vin with the potential at point C higher than that at point D.

When the controllable switch S21 is next switched on (closed), point B of C21 goes to negative and the capacitor C22 is discharged to one diode drop below ground through the inductor L21, the diode D22 and the capacitor C21. The voltage across C22 will remain substantially unchanged for the remaining period of this switch-on cycle and the voltage across C21 is thus also lowered by the same amount.

When the controllable switch S21 is next switched off (open), the capacitor C21 will be charged to the same voltage level as when the switch S21 was first opened before and the voltage across the switch S21 will be equal to one diode drop ($V_{D24}$) above point C of the capacitor C22. At this point, the voltage of the switch S21 will rise from zero and zero-voltage-switching is thereby achieved.

OBJECT OF THE INVENTION

It would be obvious from the above that switching power converters incorporating simple lossless snubber networks are desirable as they will alleviate the problems associated with conventional power converters and improve operating efficiency while at the same time reducing their size and costs. It is therefore an object of the present invention to provide lossless snubber network topologies and power converters incorporating the same so that the public is at least given a useful alternative. Accordingly, there is provided a switching power converter having a lossless reactive snubber network which alleviates the disadvantages associated with prior art converters and provides the public with a useful choice.

SUMMARY OF THE INVENTION

According to a first aspect of the present invention, the invention may broadly be said to consist of a snubber network for use with a switching power converter and for connection between a power source and a controllable switch, said snubber network comprises a first series connection, a second series connection and a third diode, wherein:

said first series connection comprises a first capacitor and a first diode, said second series connection comprises a second capacitor and a sub-series connection of an inductor and a second diode, said second series connection is connected to said first series connection by connecting the end of said second capacitor which is not connected to said sub-series connection to the junction connecting said first diode and said first capacitor of said first series connection; and said third diode is connected between a terminal of said power source and the junction at which said second capacitor connects with said sub-series connection.

Preferably, in the above snubber network, the first capacitor is connected to the anode of said first diode, the cathode of said second diode is connected to said second capacitor either directly or via said inductor, and the anode of said third diode is connected to said second capacitor.

Preferably, the said first capacitor is connected to the cathode of said first diode, the anode of said second diode is connected to said second capacitor either directly or via said inductor, and the cathode of said third diode is connected to the junction between said second capacitor and said sub-series connection.

Preferably, the capacitance of aforesaid first capacitor is significantly larger than that of the aforesaid said second capacitor; and the combined reactance of said second capacitor and said inductor is such that the voltage across said second capacitor will be double that across said first capacitor at resonance.

In a second aspect of the present invention, there are provided switching power converters in which the novel snubber networks described herein are incorporated, either individually or in combination, into the switching circuitry to reduce the stress to which the controllable switch will be exposed during turning off of the switch.

Accordingly, there is provided in the present invention a power converter incorporating a novel lossless snubber network wherein said snubber network comprises a first series connection, a second series connection and a third diode, wherein:

said first series connection comprises a first capacitor and a first diode, said second series connection comprises a second capacitor and a sub-series connection of an inductor and a second diode, said second series connection is connected to said first series connection by connecting the end of said second capacitor which is not connected to said sub-series connection to the junction connecting said first diode and said first capacitor of said first series connection; and said third diode is connected between a terminal of said power source and the junction at which said second capacitor connects with said sub-series connection.

Preferably, the other features of the said snubber networks described and mentioned herein are incorporated into the improved power converters according to the present invention.

BRIEF DESCRIPTION OF THE DIAGRAMS

Embodiments of the present invention will now be explained, by way of examples and with reference to the accompanying diagrams, in which.

DETAILED DESCRIPTION OF THE INVENTION

Figure 1:
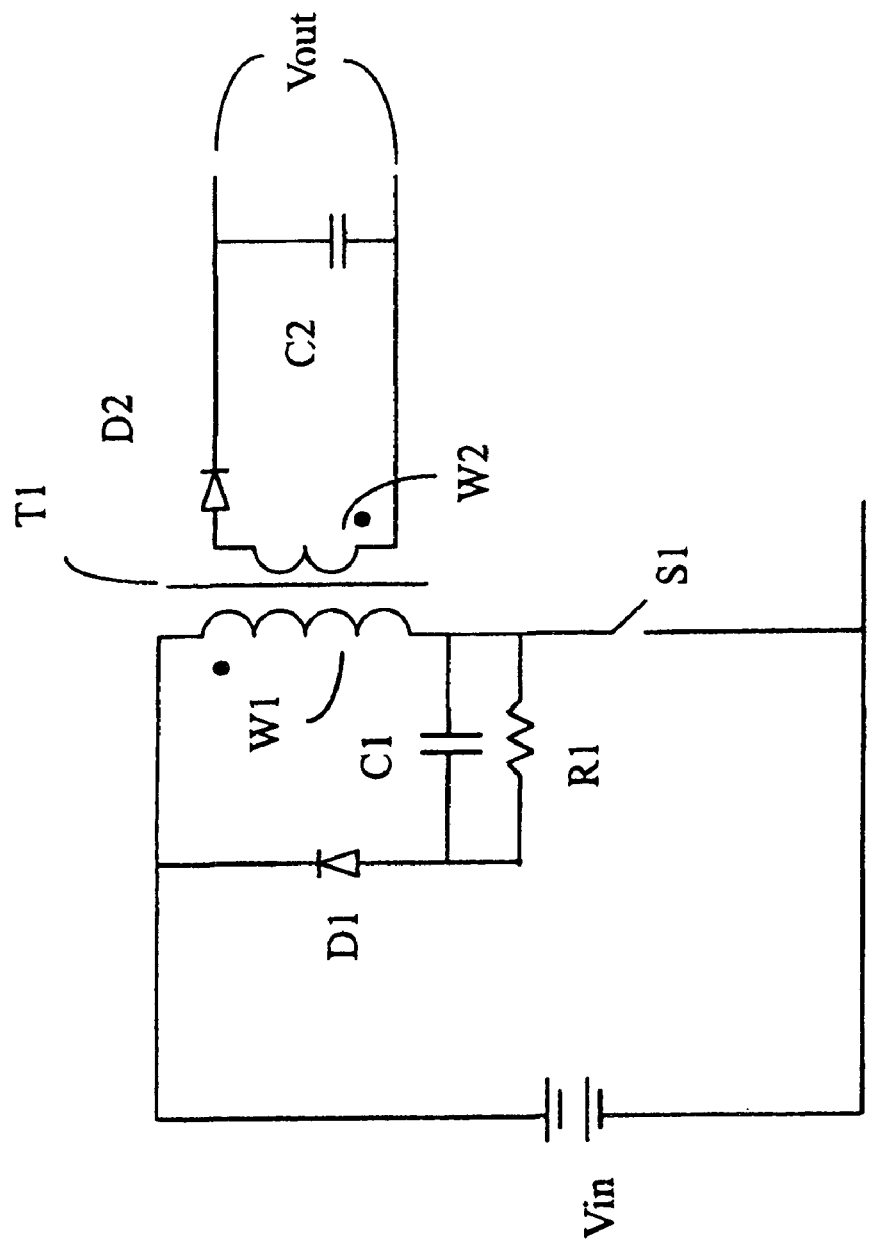
FIG. 1 is a schematic circuit diagram of a prior art power converter with a dissipative reactive snubber network.
Figure 2:
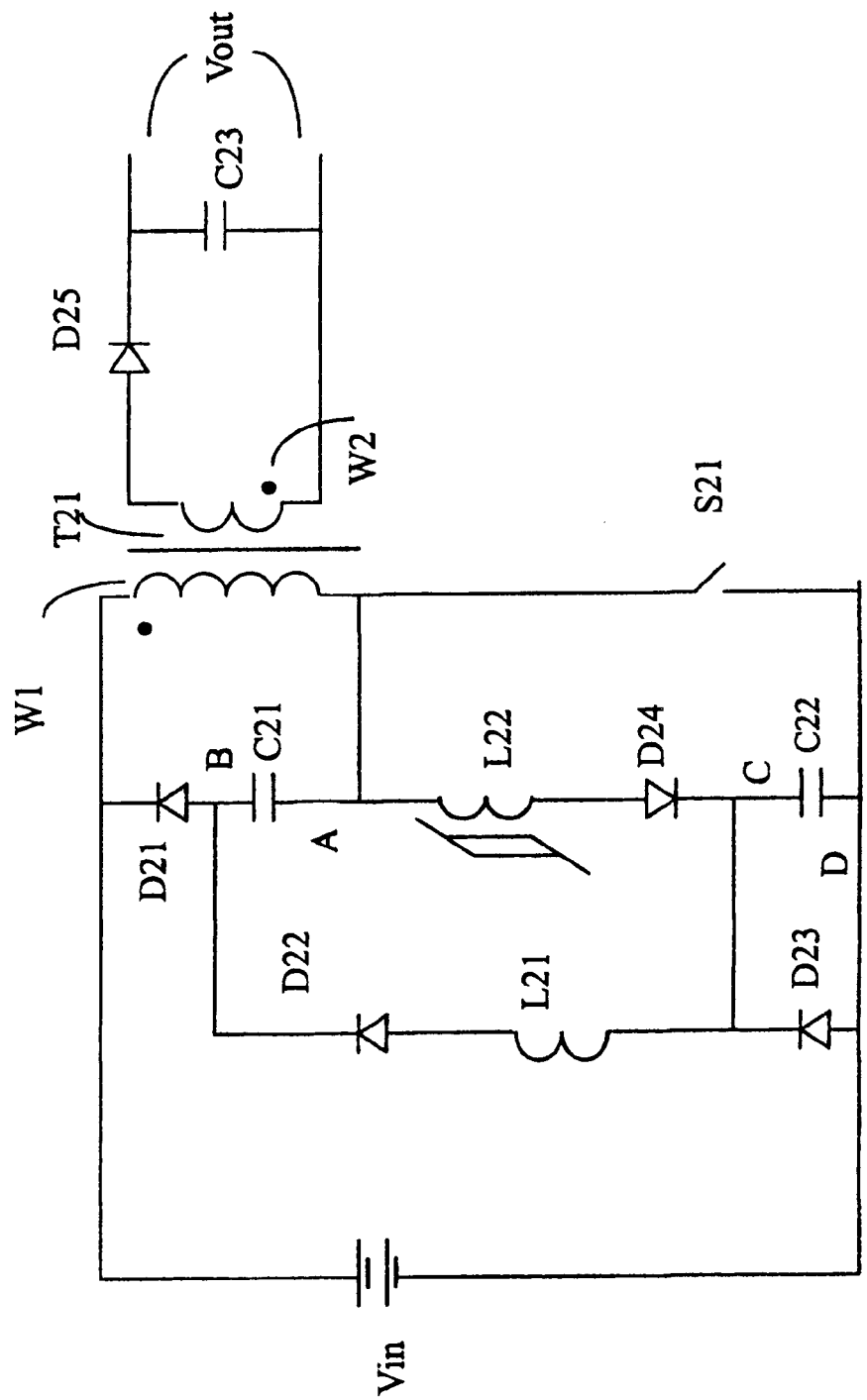
FIG. 2 is schematic circuit diagram of a prior art power converter with a lossless reactive snubber network.
Figure 3:
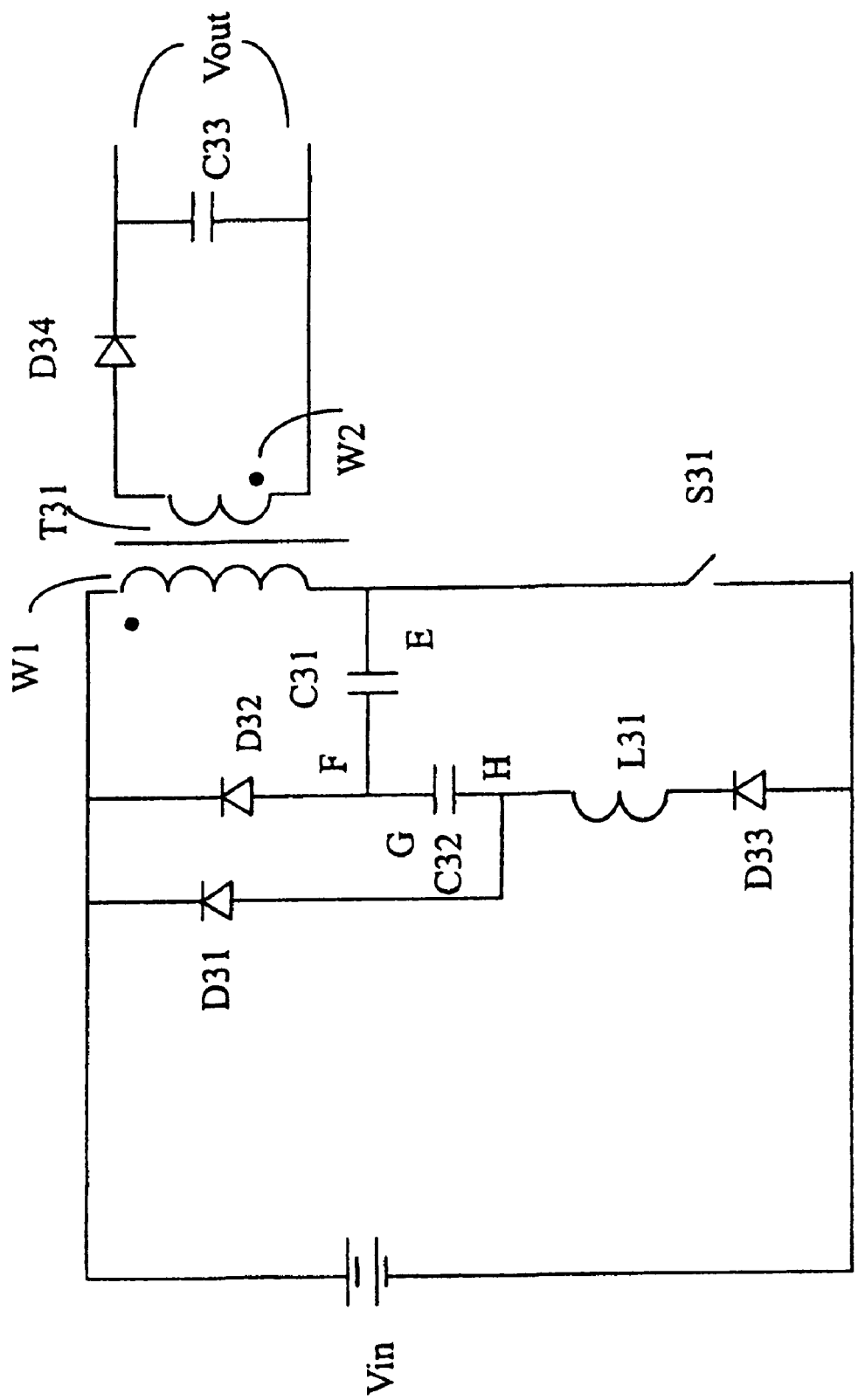
FIG. 3 is a schematic circuit diagram of a power converter incorporating a first embodiment of a lossless snubber network of the present invention.

Referring to FIG. 3, there is shown a schematic circuit diagram of a switching power converter incorporating a first embodiment of a novel passive lossless snubber network of the present invention in which the input voltage source is designated by Vin which can be a DC or rectified AC voltage source of sinusoidal or other waveforms.

The power converter has a primary and a secondary side which are mutually coupled by an isolation transformer T31 comprising primary windings W1 and secondary windings W2. The primary side of the power converter comprises a basic switching loop and the novel lossless snubber network. The switching loop is formed by a series connection of the power source Vin, primary windings W1 and a controllable switch S31 the frequency and duty-cycle of which is determined by an external control circuit.

In the absence of a snubber network, energy is transferred from the primary to the secondary side and hence to the useful load connected to the secondary windings W2 of the transformer via a diode D34 as a result of controlled switching of the controllable switch but subject to the aforesaid known problems.

The present improved lossless snubber network is a four-terminal network comprising a first series connection, a second series connection and a third diode. The first series connection has three nodes and comprises a first capacitor C31 and a first diode D32 with the anode of the first diode D32 connected to one end of the first capacitor C31. The first node of the first series connection is, for convenience, designated as the cathode of the first diode D32. The second node of the first series connection is designated as the electrical junction formed by the connection of the anode of the first diode D32 and the first capacitor C31 (point F). The third node of the first series connection is designated as the remaining end of the first capacitor C31 not connected to the first diode D32 (point E).

The second series connection also has three nodes and comprises a second capacitor C32 and a sub-series connection comprising an inductor L31 and a second diode D33. The sub-series connection is connected to the second capacitor C32 in a 20 manner in which the cathode of the diode D33 is connected towards the capacitor C32 either directly or through the inductor L31. In this second series connection, the first node is, for convenience, designated as the end of the second capacitor C32 not connected directly with the sub-series connection of the inductor L31 and the second diode D33. The second node (point H) is designated as the electrical junction between the second capacitor C32 and the sub-series connection of the inductor L31 and the second diode D33. The third node is designated as the end of the sub-series connection not directly connected to the capacitor C32, being the anode of the second diode D33 in the present Figure.

The improved snubber network is formed by the following connections: the first node of the second series connection (point G) is connected to the second node of the first series connection (point F). The anode of the diode D31 is connected to the second node (point H) of the second series connection.

With the above connections, the four terminals of the snubber network have been formed as follows: the first terminal is the cathode of the diode D31, the second terminal is the first node of the first series connection, i.e., the cathode of the diode D32, the third terminal is the third node of the first series circuit (point E), i.e., the end of the capacitor C31 not connected with the diode D32, and the fourth terminal is the third node of the second series connection, i.e., the anode of the diode D33. While the first and second terminals of the present snubber network have been interconnected, it would be appreciated without loss of generality by persons skilled in the art that components not having any material electrical influence on the performance of the network may be inserted between the first and the second terminals of this network.

The snubber network is connected to the primary side of the power converter in the following manner. The primary windings W1 are connected across the second and third terminals of the snubber network with the dotted terminal of the windings W1 connected to the second terminal. The controllable switch S31 is connected across the third and the fourth terminals of the snubber network and the power source Vin is connected across the first and fourth terminals of the snubber network with the higher potential point of Vin connected to the first terminal.

In this snubber network, the capacitance of the first capacitor C31 is selected in relation to the leakage energy of the transformer and should be substantially larger than that of C32 (for example, 10 times) for reasons to be explained below. The capacitance of the capacitor C32 and the inductance of the inductor L31 are selected so that the voltage across C32 at resonance will be double that across the capacitor C31. The operation of this snubber network will now be explained in the following.

When the switch S31 is closed for the first time, current flows from the power source Vin into the primary windings W1 via the dotted terminal and energy is stored in the transformer T31. When the switch S31 is next opened, energy is released from the secondary windings W2 of the transformer T31 to the output by a current flowing from the un-dotted terminal of the windings W2 to the output through the diode D34. At the same time, energy stored in transformer is also released to the primary side of the power converter circuit through the closed loop comprising the primary windings W1, the capacitor C31 and the diode D32, thereby charging up the capacitor C31 with the potential at the node marked E being higher than that marked F.

When the switch S31 is next closed, current again flows from the power source Vin in to the primary windings W1 through the dotted terminal to energize the transformer T31. At the same time, the capacitor C31 is partially discharged through the closed loop comprising the controllable switch S31, the diode D33, the inductor L31 and the capacitor C32, thereby charging the capacitor C32 with a polarity opposite to that across the capacitor C31 and with the potential at the terminal of the capacitor C32 marked H being higher than that marked G. Since the capacitance of C31 is selected to be much greater than that of C32, the voltage across C31 will remain substantially unchanged during this turn-on cycle of the controllable switch S31 even though C31 is being partially discharged.

Because of the double voltage criteria at resonance of the second capacitor C32 and because of the significantly larger value of capacitance of the capacitor C31 than that of the capacitor C32, the voltage across the capacitor C32 at this moment is double that across the capacitor C31 but of an opposite polarity. It would be appreciated that if the value of C31 is not significantly larger than that of C32, say for example, only 2 or 3 times that of C32, the actual voltage across C32 would have to be determined by circuit analysis as the capacitor C31 can no longer be regarded as a constant voltage source.

It will be seen from below that the energy stored in C32 at this point will be re-circulated to the input through the diode D31 when the controllable switch is next switched off (open). It is also worth noting that the stored energy described herein normally consists of the leakage energy of the transformer but magnetization energy will also be transferred if the capacitance of C32 is suitably set to relate to the magnetization energy. If the magnetization energy is less than the energy stored in C32 during each cycle, the portion of magnetization energy being transferred will be equal to the difference of the energy stored in C32 and the leakage energy.

At the first time interval when the switch S31 is next opened (turned off), the instantaneous voltage across the two opened terminals of the controllable switch S31 is given by the sum of the voltages across the capacitor C31 ($V_{EF}$), the capacitor C32 ($V_{GH}$), the diode D31 (which is negligible) and the power source Vin. Since the voltage across the capacitor C32 just before the opening of the switch S31 is double that across the capacitor C31 and is opposite to the polarity of Vin and C31, the voltage across the controllable switch S31 at this moment is therefore equal to Vin–$V_{C31}$. Also, since the voltage across the capacitor C31 is determined by the turn ratio of the primary and secondary windings W1 and W2 of the transformer T31 and the output voltage $V_{out}$, zero voltage switching off (ZVSO) off can be achieved by designing the transformer T31 so that the voltage across the capacitor C31 is substantially equal to the input voltage Vin.

After the switch S31 has been opened (turned off) as aforesaid, the energy stored in the primary windings W1 of the transformer T31 as a result of the last closing of the switch S31 will be released by way of currents flowing through a first closed loop comprising the windings W1, the capacitor C31 and the diode D32 and a second closed loop comprising the primary windings W1, the capacitor C31 and capacitor C32 and the diode D31. Because of the different polarities across the capacitors C31 and C32 and because of the clamping by the diode D32 across the series connection of the capacitor C32 and the diode D31, the capacitor C31 is charged while the capacitor C32 is discharged through the diode D31. In this way, the capacitor C32 is fully discharged while the capacitor C31 is fully charged through the diode D32 with the potential at point E of the capacitor C31 being higher than that at point F. At the same time, the energy stored in the transformer T31 is transferred to the output capacitor C33 and the output loading through the secondary windings W2 and the diode D34. From this point on, the power converter will be operating on the basis of zero-voltage-switching-off in a manner as described in the last on- and off-switching cycles.

It is also worth noting from the above that the energy in the transformer during the turn-on (closed) cycle of the switch S31 will be subsequently transferred from the transformer to the output in the next turn-off (open) cycle of the switch S31. At that point, the capacitor C33 is also being charged up through the diode D34 and will supply power to the output during the next turn-on cycle of the switch S31, thereby providing continuous power supply to the output. This type of power converters in which energy is transferred from the primary to the secondary during the turn off period of the controllable switch is usually referred to as the 'flyback converter'.

Figure 4:
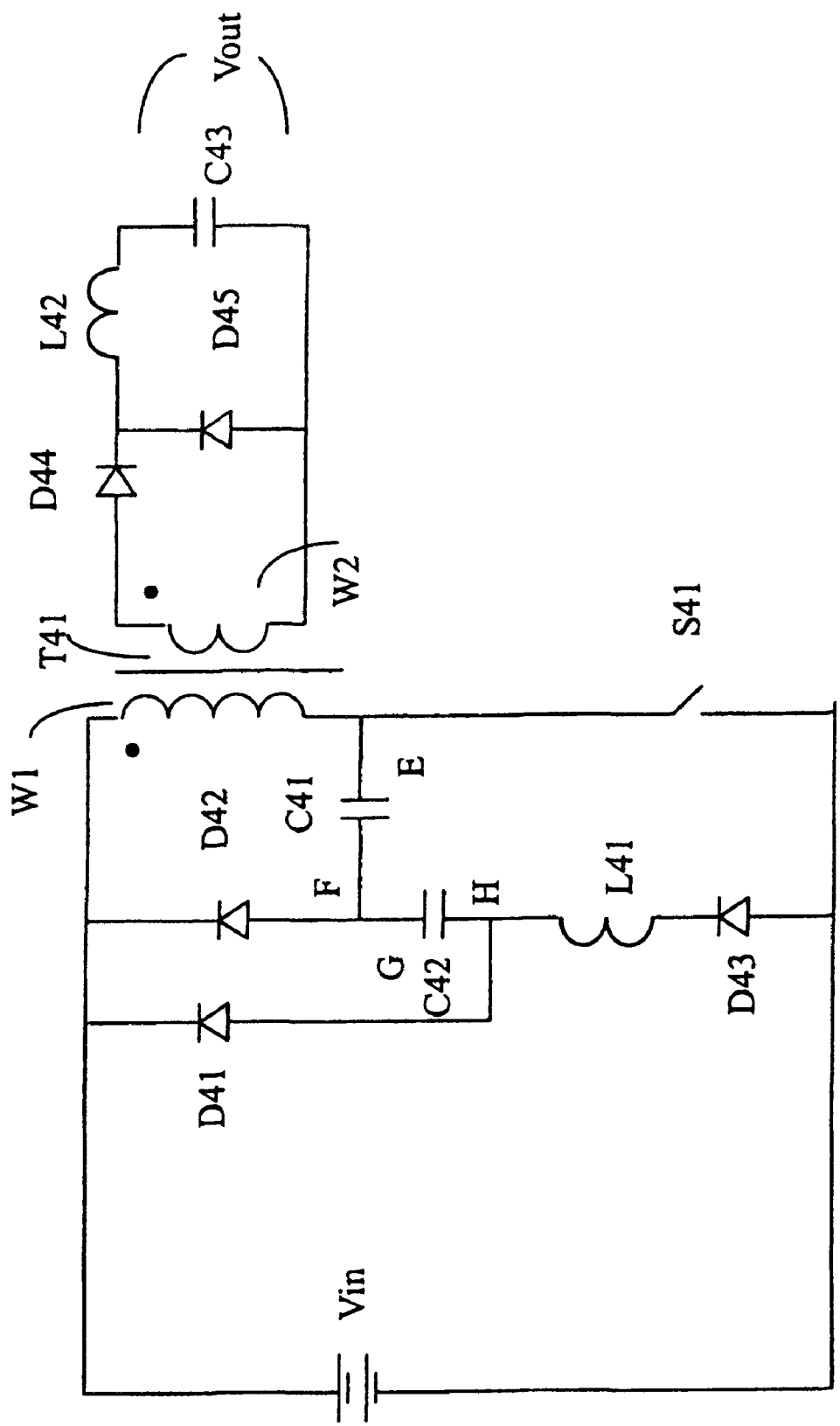
FIG. 4 is a schematic circuit diagram exemplifying a second application of the first embodiment of the present improved lossless snubber network in a power converter.

In FIG. 4, there is shown a second application of the first embodiment of the present invention in which the circuit on the primary side is identical to that shown in FIG. 3 but the circuit on the secondary side has been somewhat modified. Referring to the Figure, the dotted terminal in the secondary side is on the other end of the secondary windings W2, an additional inductor is connected in series between the cathode of the output diode D44 and the output capacitor C43 and a diode D45 is connected between the un-dotted terminal of the secondary windings W2 and the cathode of the output diode D44 with cathodes of both diodes connected together.

With this change of circuit arrangement on the secondary side, energy will be transferred from the primary side of the circuit to the secondary side during the turn-on period of the controllable switch S41 in the following manner. When the switch S41 is turned on, current flows from the power source Vin through the diode D44 and the inductor L42 to the output. When the switch S41 is turned off, the energy stored in the inductor L42 is released to the output through the diode D45 and the capacitor C43 has the effect of reducing the ripple at the output. This type of power converter which is characterized by energy transfer during the turn-on period of the controllable switch is generally categorized as a 'forward converter'. An important advantage of a forward converter is that more energy can be transferred to the output with the same size of transformer.

Figure 5:
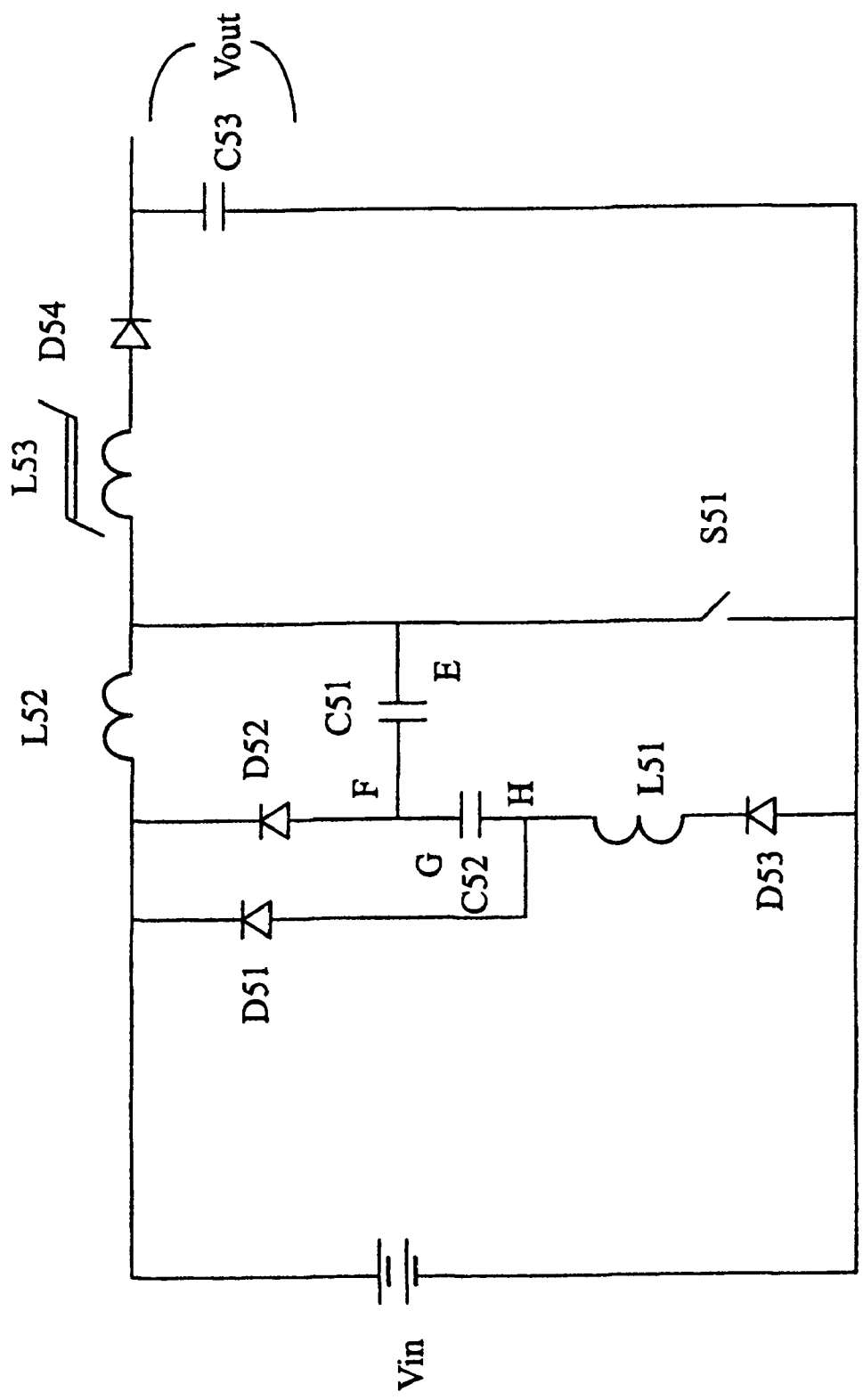
FIG. 5 is a schematic circuit diagram exemplifying a third application of the first embodiment of the present improved lossless snubber network in a power converter.

Referring to FIG. 5, there is shown a third application of the first embodiment of the present invention in which the circuit arrangement is substantially similar to that described in FIG. 3 but with the isolation transformer being replaced by two serially connected inductors L52 and L53. In this application, the primary and secondary windings W1 & W2 in the first application are replaced respectively by the an inductors L52 and a saturable inductor L53 so that the stress caused by the reverse recovery current of the rectifying diodes can be somewhat reduced.

Figure 6:
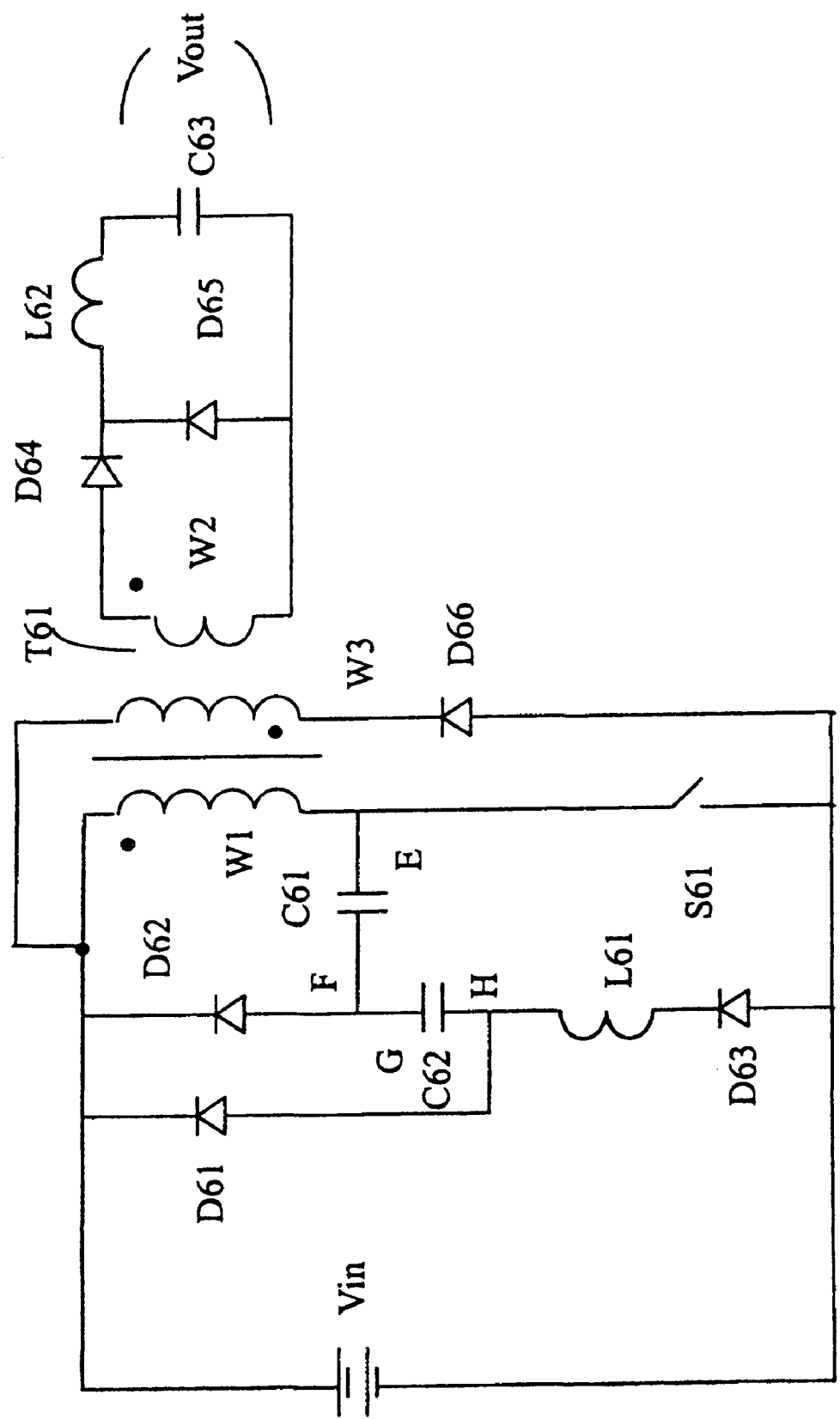
FIG. 6 is a schematic circuit diagram exemplifying a fourth application of the first embodiment of the present improved lossless snubber network in a power converter.

Referring now to FIG. 6 in which there is shown a fourth application of the first embodiment of the present invention. The circuit configuration in this application is identical to that of the second application as shown in FIG. 4 except that an additional series connection of windings W3 and a diode D66 is connected in parallel across the primary windings W1 and controllable switch S61. The operation of this circuit is basically the same as that of the second application during the turn-on period of the switch S41 but the additional series connection will bring about energy transfer also during the turn-off period of the controllable switch S61.

When the controllable switch S61 is turned on, the magnetic energy of the transformer increases but this energy can not be directly transferred to the secondary side because of the blocking diode D64 which is reversed biased during the turn-off cycle of the switch S61. However, with the windings W3 having the dotted terminal connected in the manner as shown in FIG. 6 and with the diode D66 so serially connected, the stored magnetic energy will be released back to the primary side during the turn-off cycle of the controllable switch, thereby reducing the energy stored in the transformer. Since the windings W3 is connected to the input voltage source Vin through the diode D66, the voltage across the windings W3 will be equal to the voltage Vin across the voltage source plus the voltage drop, $V_{D66}$, across the diode D66. By selecting windings W1 and W3 so that both have the same number of windings, the voltage across W1 is the same as that across W3, namely Vin+$V_{D66}$ during the turn off period of the switch S61. At the same time, the capacitor C61 will be charged up to the same voltage, namely Vin+$V_{D66}$, thereby facilitating substantially a zero voltage switching.

Figure 7:
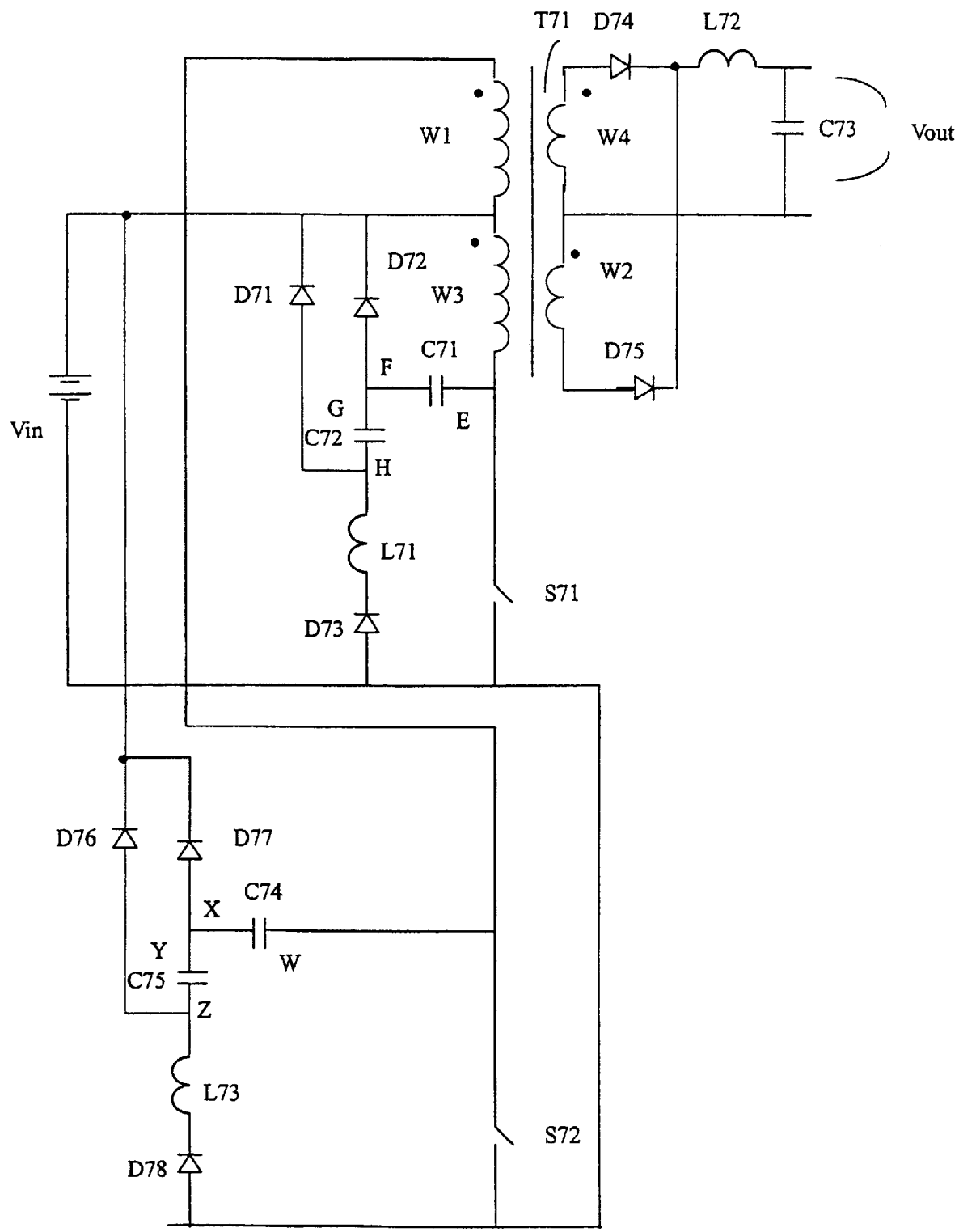
FIG. 7 is a schematic circuit diagram exemplifying a fifth application of the first embodiment of the present improved lossless snubber network in a power converter.

Referring to the fifth application of the first embodiment as shown in FIG. 7, there are shown two snubberred power switching networks connected in parallel to the power source Vin. The first switching network is identical to that shown in FIG. 3 while the second switch network is also identical to the first switching network except to the extent that the un-dotted terminal of the windings W1 of the second switching network is connected to the high potential point of the power source Vin. It will be appreciated that the secondary side of this embodiment is similar to the output circuit of a conventional full wave rectifier.

In this configuration, the number of windings in W1 is selected to be equal to that of W3 and the number of windings of W2 equal to W4 and the switches S71 and S72 are designed to be turned on and off alternately so that they are always 180 degrees out of phase. It should be observed that during the so-called 'dead time' when both switches S71 and S72 are turned off, the voltage across the windings W2 and W4 are forced to zero because the current flowing in the inductor L72 and the diodes D74 and D75 are equal and opposite. When the switch S71 is turned off and the switch S72 is on, the voltage across the windings W1 equals Vin. This same voltage Vin is induced in the windings W3 and the capacitor C71 is therefore also charged to Vin. Similarly, in the next cycle, when S71 is turned on and S72 is turned off, the capacitor C74 will also be charged to Vin. Hence, the voltage across C71 and C74 will be alternatively charged to Vin when the switches S72 and S71 are respectively on, thereby facilitating a substantially zero voltage switching.

Figure 8:
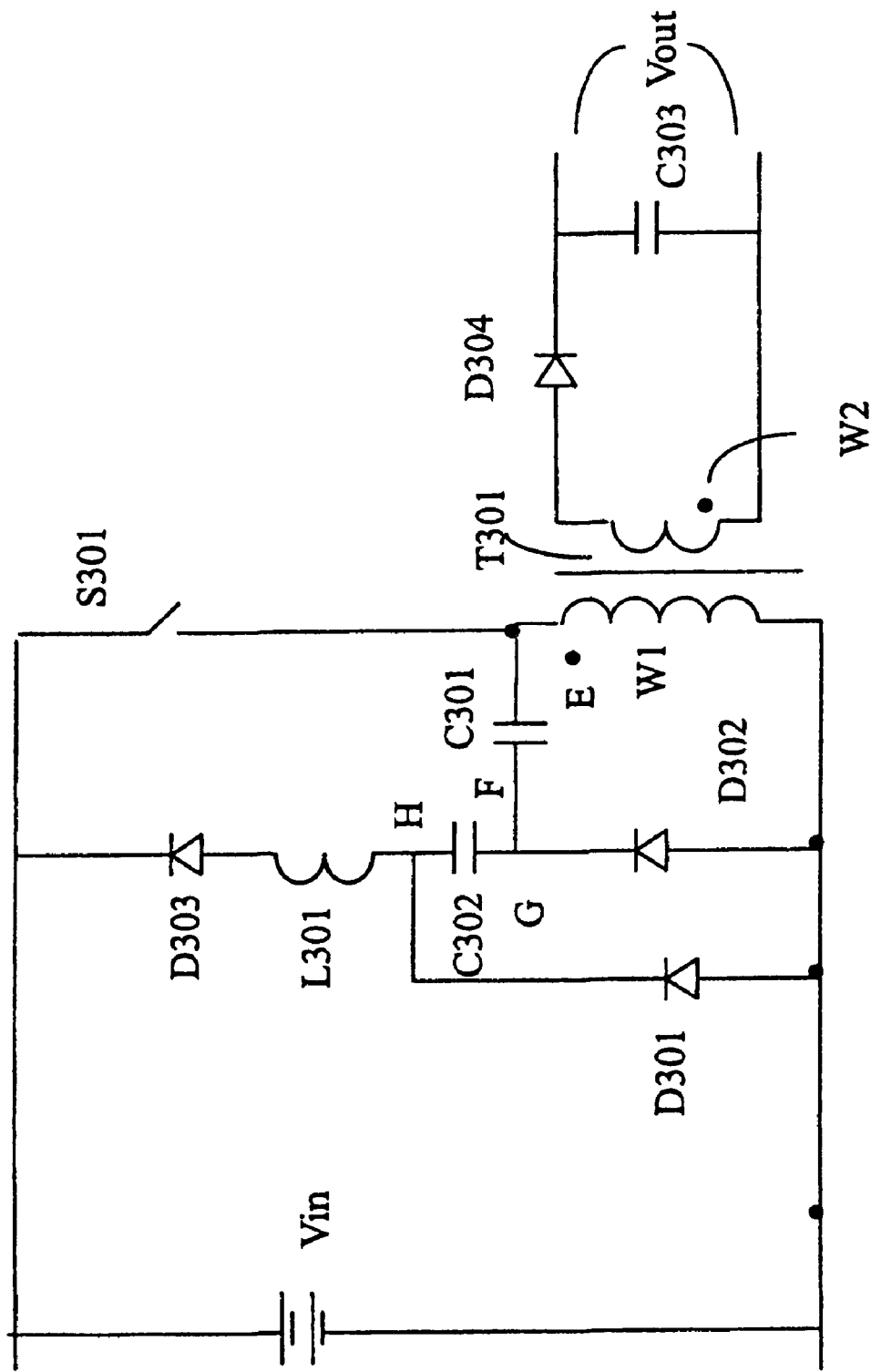
FIG. 8 is a schematic circuit diagram of a power converter incorporating a second embodiment of a lossless snubber network of the present invention.

Referring now to FIG. 8, there is shown a second embodiment of the present invention in which the improved lossless snubber network is also a four-terminal network comprising a first series connection, a second series connection and a third diode. Similar to the first embodiment, the first series connection has three nodes and comprises a first capacitor C301 and a first diode D302 with the cathode of the first diode D302 being connected to one end of the first capacitor C301. The first node of the first series connection is, for convenience, designated as the anode of the first diode D302. The second node of the first series connection is designated as the electrical junction formed by the connection of the cathode of the first diode D302 and the first capacitor C301 (point F). The third node of the first series connection is designated as the remaining end of the first capacitor C301 not being connected to the first diode D302 (point E).

The second series connection also has three nodes and comprises a second capacitor C302 and a sub-series connection comprising an inductor L301 and a second diode D303. The sub-series connection is connected to the second capacitor C302 in a manner in which the anode of the diode D303 is connected towards the capacitor C302 either directly or through the inductor L301. In this second series connection, the first node is, for convenience, designated as the end of the second capacitor C302 not connected directly with the sub-series connection of the inductor L301 and the second diode D303. The second node (point H) is designated as the electrical junction between the second capacitor C302 and the sub-series connection of the inductor L301 and the second diode D303. The third node is designated as the end of the sub-series connection not directly connected to the capacitor C302, being the cathode of the second diode D303 in the present Figure.

This second embodiment of the improved snubber network is formed by the same inter-connections as described earlier on in the first embodiment and as follows: the first node of the second series connection (point G) is connected to the second node of the first series connection (point F). The cathode of the diode D301 is connected to the second node (point H) of the second series connection.

Similarly, with the above connections, the four terminals of the snubber network have been formed as follows: the first terminal is the anode of the diode D301, the second terminal is the first node of the first series connection, i.e., the anode of the diode D302, the third terminal is the third node of the first series circuit (point E), i.e., the end of the capacitor C301 not connected with the diode D302, and the fourth terminal is the third node of the second series connection, i.e., the cathode of the diode D303. While the first and second terminals of the present snubber network have been interconnected, it would again be appreciated without loss of generality by persons skilled in the art that components not having any material electrical influence on the performance of the network may be inserted between the first and two terminals of this network.

The snubber network is connected to the primary side of the power converter in the following manner. The primary windings W1 are connected across the second and third terminals of the snubber network with the dotted terminal of the windings W1 connected to the second terminal. The controllable switch S301 is connected across the third and the fourth terminals of the snubber network and the power source Vin is connected across the first and fourth terminals of the snubber network with the higher potential point of Vin connected to the fourth terminal. In this connection, it will be observed that the network inter-connection of the second embodiment is substantially a mirror image of the first embodiment with appropriate polarity reversal as regards the diodes and the voltage source Vin.

Similar to the first embodiment, the capacitance of the first capacitor C301 should be substantially larger than that of C302 (for example, 10 times) and the capacitance of the capacitor C302 and the inductance of the inductor L301 are selected so that the voltage across the capacitor C302 at resonance will be double that across the capacitor C301. The operation of this snubber network will now be briefly explained in the following.

When the switch S301 is closed for the first time, current flows from the power source Vin into the primary windings W1 via the dotted terminal and energy is stored in the transformer T301. When the switch S301 is next opened, energy is released from the secondary windings W2 of the transformer T301 to the output by a current flowing from the un-dotted terminal of the windings W2 to the output through the diode D304. At the same time, energy stored in transformer is also released to the primary side of the power converter circuit through the closed loop comprising the primary windings W1, the capacitor C301 and the diode D302, thereby charging up the capacitor C301 with the potential at the node marked F being higher than that marked E.

When the switch S301 is next closed, current again flows from the power source Vin in to the primary windings W1 through the dotted terminal to energize the transformer T301. At the same time, the capacitor C301 is partially discharged through the closed loop comprising the controllable switch S301, the diode D303, the inductor L301 and the capacitor C302, thereby charging up the capacitor C302 with a polarity opposite to that across the capacitor C301 and with the potential at the terminal of the capacitor C302 marked G being higher than that marked H.

Since the capacitance of C301 is selected to be much greater than that of C302, the voltage across C301 will remain substantially unchanged during this turn-on cycle of the controllable switch S301 even though C301 is being partially discharged.

Because of the double voltage criteria at resonance of the second capacitor C302 and because of the significantly larger value of capacitance of the capacitor C301 than that of the capacitor C302, the voltage across the capacitor C302 at this moment is double that across the capacitor C301 but of an opposite polarity. Similar to the first embodiment, if the value of C301 is not significantly larger than that of C302, say for example, only 2 or 3 times that of C302, the actual voltage across C302 would have to be determined by circuit analysis as the capacitor C301 can no longer be regarded as a constant voltage source.

At the first time interval when the switch S301 is next opened (turned off), the instantaneous voltage across the two opened terminals of the controllable switch S301 is given by the sum of the voltages across the capacitor C301 ($V_{EF}$), the capacitor C302 ($V_{GH}$), the diode D301 (which is negligible) and the power source Vin. Since the voltage across the capacitor C302 just before the opening of the switch S301 is double that across the capacitor C301 and is opposite to the polarity of Vin and C301, the voltage across the controllable switch S301 at this moment is therefore equal to Vin–$V_{C301}$. Also, since the voltage across the capacitor C301 is determined by the turn ratio of the primary and secondary windings W1 and W2 of the transformer T301 and the output voltage $V_{out}$, zero voltage switching off (ZVSO) can be achieved by designing the transformer T301 so that the voltage across the capacitor C301 is substantially equal to the input voltage Vin.

After the switch S301 has been opened (turned off) as aforesaid, the energy stored in the primary windings W1 of the transformer T301 as a result of the last closing of the switch S301 will be released by way of currents flowing through a first closed loop comprising the windings W1, the capacitor C301 and the diode D302 and a second closed loop comprising the primary windings W1, the capacitor C301 and capacitor C302 and the diode D301. Because of the different polarities across the capacitors C301 and C302 and because of the clamping by the diode D302 across the series connection of the capacitor C302 and the diode D301, the capacitor C301 is charged while the capacitor C302 is discharged through the diode D301. In this way, the capacitor C302 is fully discharged while the capacitor C301 is fully charged through the diode D302 with the potential at point F of the capacitor C301 being higher than that at point E. At the same time, the energy stored in the transformer T301 is transferred to the output capacitor C303 and the output loading through the secondary windings W2 and the diode D304. From this point on, the power converter will be operating on the basis of zero-voltage-switching-off in a manner as described in the last two on- and off-switching cycles.

Similar to the first embodiment, the energy in the transformer during the turn-on (closed) cycle of the switch S301 will be subsequently transferred from the transformer to the output in the next turn-off (open) cycle of the switch S301.

At that point, the capacitor C303 is also being charged up through the diode D304 and will supply power to the output during the next turn-on cycle of the switch S301, thereby providing continuous power supply to the output. While only one application of the second embodiment has been described here, it would be appreciated that the other applications of the first embodiment will be applicable to the second embodiment with appropriate modifications which would be obvious to persons skilled in the art. Furthermore, while the present embodiments and applications have been illustrated with reference to "zero voltage switching off", it should be appreciated that the applications of the present invention are not limited to zero voltage switching but can be applied in many circumstances in which it is desirable to reduce the stress at the switches during switching off.

Figure 9:
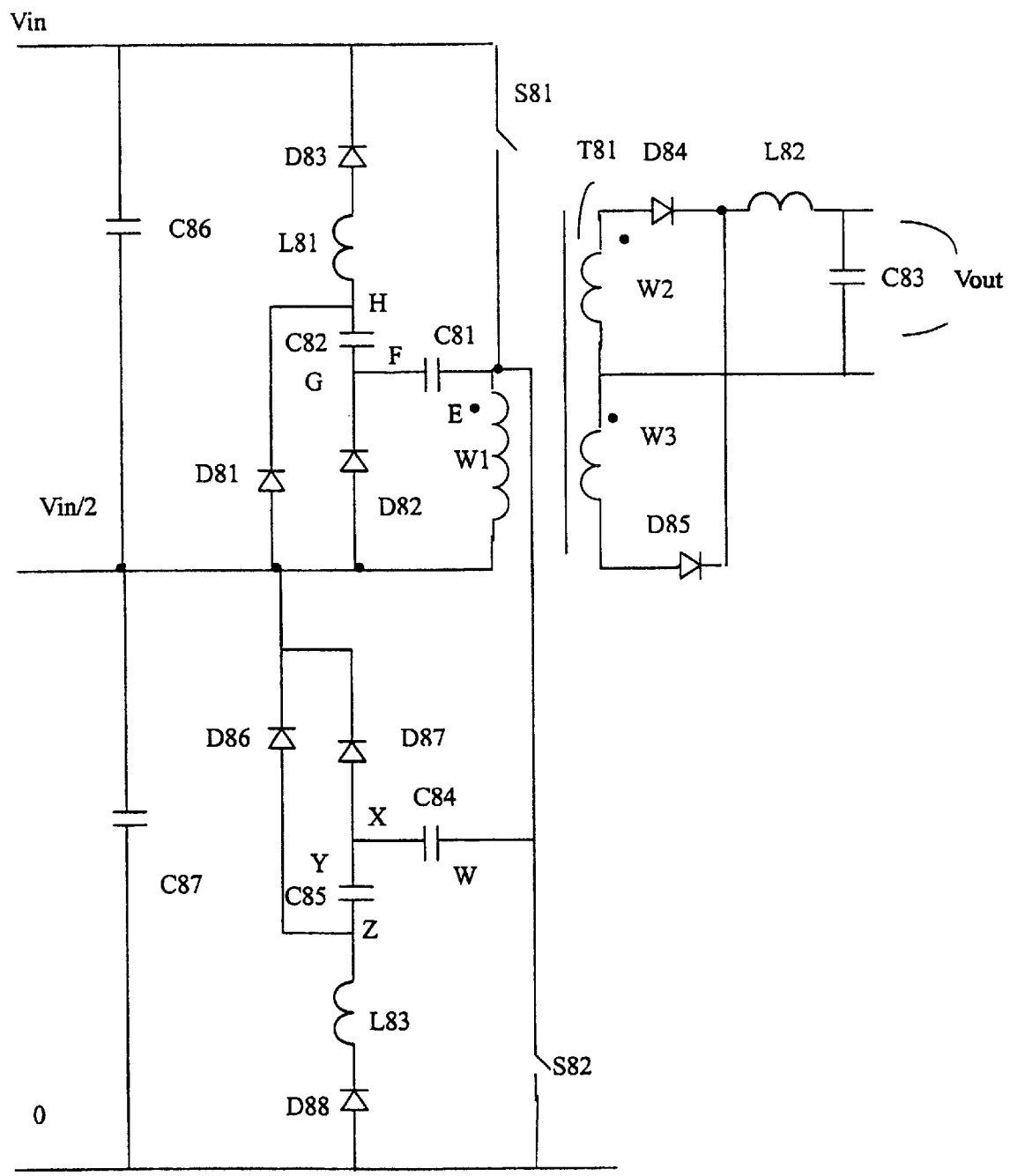
FIG. 9 is a schematic circuit diagram exemplifying the simultaneous application of the first and the second embodiments of the present invention in a power converter.

In FIG. 9, there is shown a further application of the present invention in which both the first and second embodiments of the present invention are applied in a single switching power converter. In this application, the power source Vin is divided at its mid-point by a potential divider comprising two capacitors C86 and C87 which equally divides the voltage across the power source Vin. With this capacitive potential division in consideration, the voltage source Vin can be considered as two serially connected capacitive power sources each of an input voltage equal to Vin/2, say Vin'.

With the above consideration, the primary part of this application can be considered as comprising two snubber blocks which are connected in series and each of which is connected across the capacitive power source Vin'. The first snubber block is a snubber network of the first embodiment which is connected between the mid-potential point Vin/2 and the low-potential point (0). The second snubber block is a snubber network of the second embodiment which is connected between the high-potential point Vin and the mid-potential point Vin/2. Hence, the configuration in FIG. 9 is identical to connecting the primary parts of the embodiments of FIG. 3 and FIG. 8 in series except that the primary windings W1 are being shared by the two series blocks.

In this application, the controllable switches S81 and S82 are designed to operate on an "alternate on" basis so that only one of the switches will be on at a time but there will be the so-called "dead time" during which both switches are off. When the switch S81 is on and the switch S82 is off, the primary current flows from the point Vin to the mid-potential point between the capacitors C86 and C87. At the same time, the secondary current flows from the dotted terminal of the windings W2, through the diode D84 and the inductor L82 to the output loading and also charges up the capacitor C83. When the switch S82 is on and the switch S81 is off, the primary current flows from the mid-potential point (Vin/2) through the shared primary windings W1 and the switch S82 to the low-potential point (0). At this moment, the secondary current flows out from the un-dotted terminal of the secondary windings W3, through the diode D85 and the inductor L82 to the output loading and also charges up the capacitor C83. This sequence repeats after a period of dead time has elapsed.

For the sake of completeness, it would be observed that the voltages across the windings W2 and W3 are substantially forced to zero during the dead time because the currents flowing in the inductor L82 and the diodes D84 and D85 are equal and opposite. The energy stored in the inductor L82 and the capacitor C83 is released to the output loading during this period.

Recalling from the first and second embodiments of FIGS. 3 and 8 above, it would be appreciated that the capacitor C85 will be charged to two times the voltage across the capacitor C84 and its voltage will be equal to Vin when the switch S82 is turned on, thereby providing a zero voltage switching off condition for the turning off of the switch S82. At this time, the capacitor C81 will be charged to ½ Vin through the mid-potential point defined by the junction of the potential dividing capacitors C86 and C87 and via the connection from the diode D82 and the switch S82 to the zero potential point. The voltage across C81 will in turn charge the capacitor C82 to Vin when the switch S81 is next turned on, thereby providing condition for zero voltage turning off of the switch S82.

Hence, it would be appreciated that the underlying operation of this application is equivalent to the alternate application of the two embodiments but with the advantage that the maximum stress across each of the snubber blocks is only half of that of the earlier applications as a result of the potential division.

While embodiments of lossless snubber networks together with a plurality of applications for use in switching power converters have been described in the above and with reference to the drawings, it should be appreciated that these applications are for illustrations only and should not be considered as an exhaustive application of the present invention. Also, while the present embodiments have been explained with reference to a DC source and to specific component arrangements, it would be understood by persons skilled in the art that other power sources and alternative component arrangements can be used in a way not affecting the scope of the present invention. Furthermore, it should be appreciated that the relative disposition of components is only for illustration only and can be re-arranged to the extent that it is practicable and without loss of generality.

What is claimed is:

1. A snubber network for use with a switching power converter and for connection between a power source and a controllable switch, comprising a first series connection, a second series connection and a third diode, wherein:
    said first series connection comprises a first capacitor and a first diode, said second series connection comprises a second capacitor and a sub-series connection of an inductor and a second diode;
    said second series connection is connected to said first series connection by connecting the end of said second capacitor which is not connected to said sub-series connection to the junction connecting said first diode and said first capacitor of said first series connection; and
    said third diode is connected between a terminal of said power source and the junction at which said second capacitor connects with said sub-series connection.

2. A snubber network according to claim 1, wherein:
    said first capacitor is connected to the anode of said first diode;
    the cathode of said second diode is connected to said second capacitor either directly or via said inductor; and
    the anode of said third diode is connected to said second capacitor.

3. A snubber network according to claim 1, wherein:
    said first capacitor is connected to the cathode of said first diode;
    the anode of said second diode is connected to said second capacitor either directly or via said inductor; and
    the cathode of said third diode is connected to the junction between said second capacitor and said sub-series connection.

4. A snubber network according to claim 1, wherein:
    the capacitance of said first capacitor is significantly larger than that of said second capacitor; and
    the combined reactance of said second capacitor and said inductor is such that the voltage across said second capacitor will be double that across said first capacitor at resonance.

5. A snubber network according to claim 1, wherein said controllable switch is connected between the end of said first capacitor not being connected to said first diode and the end of said sub-series connection not being connected to said second diode.

6. A snubber network according to claim 1, wherein said controllable switch is connected between the end of said first capacitor not being connected to said first diode and the end of said sub-series connection not being connected to said second diode; and
    the end of said sub-series connection being in connection with said controllable switch is in connection with the other terminal of said power source which is not being connected with said third diode.

7. A snubber network according to claim 1, wherein the power source of said power converter is separated from the output by an isolation transformer, wherein:
    the primary windings of said isolation transformer are connected between the two ends of said first series connection.

8. A four-terminal snubber network for use with a switching power converter and comprising a first series connection, a second series connection and a third diode, wherein:
    said first series connection comprises a first capacitor and a first diode,
    said second series connection comprises a second capacitor and a sub-series connection of an inductor and a second diode,
    said second series connection is connected to said first series connection by connecting the end of said second capacitor which is not connected to said sub-series connection to the junction connecting said first diode and said first capacitor of said first series connection;
    said third diode is connected to the junction at which said second capacitor connects with said sub-series connection; and wherein
    the first terminal is the end of said third diode not connected to said second series connection,
    the second terminal is the end of said first diode not connected to said first capacitor;
    the third terminal is the end of said first capacitor not connected to said first diode; and the fourth terminal is the end of said sub-series connection not connected to said second capacitor.

9. A snubber network according to claim 8, wherein the controllable switch of said power converter is connected between the third and fourth terminals of said snubber network and the power source is connected between the first and fourth terminals of said snubber network.

10. A snubber network according to claim 9 wherein the second and third terminals of said snubber network are connected to the primary windings of an isolation transformer.

11. A switching power converter incorporating a snubber network of claim 1, wherein said power converter has a power source connected in series with a controllable switch and the primary windings of an isolation transformer and wherein said snubber network is connected between said power source and said controllable switch.

12. A switching power converter incorporating a snubber network of claim 2, wherein said power converter has a power source connected in series with a controllable switch and the primary windings of an isolation transformer and wherein said snubber network is connected to said power converter in the following manner:

the cathode of said third diode is connected to the high potential point of said power source;

the cathode of said first diode is connected to the dotted terminal of said primary windings;

the end of said first capacitor not connected to the anode of said first diode is connected to the un-dotted terminal of said primary windings and to one end of said controllable switch;

the anode of said second diode is connected to the low potential point of said power source and to the other end of the controllable switch not connected to said first capacitor; and the output of said power converter is connected to the secondary windings of the said isolation transformer via a serially connected diode wherein the anode of said diode is connected to the un-dotted terminal of said secondary windings.

13. A switching power converter incorporating a snubber network of claim 3, wherein said power converter has a power source connected in series with a controllable switch and the primary windings of an isolation transformer and wherein said snubber network is connected to said power converter in the following manner:

the anode of said third diode is connected to the low potential point of said power source;

the anode of said first diode is connected to the un-dotted terminal of said primary windings;

the end of said first capacitor not connected to the cathode of said first diode is connected to the dotted terminal of said primary windings and to one end of said controllable switch;

the cathode of said second diode is connected to the high potential point of said power source and to the other end of the controllable switch not connected to said first capacitor; and the output of said power converter is connected to the secondary windings of the said isolation transformer via a serially connected diode wherein the anode of said diode is connected to the un-dotted terminal of said secondary windings.

14. A switching power converter according to claim 12, wherein the output of said power converter is connected to the secondary windings of the said isolation transformer via a series connection of a diode and an inductor wherein the anode of said diode is connected to the dotted terminal of said secondary windings, an additional diode is connected between the un-dotted terminal of said secondary windings and the junction between the said diode and said induction of said series connection with the anode so that the cathodes of both diodes in the secondary side of the isolation transformer are connected.

15. A switching power converter incorporating a duplicate of the snubber networks of claim 2 connected in parallel across the power source of said power converter, wherein the controllable switches connected to the two snubber networks operate on an alternate-on basis so that only one of the two switches are on at a time.

16. A switching power converter incorporating a duplicate of the snubber networks of claim 3 connected in parallel across the power source of said power converter, wherein the controllable switches connected to the two snubber networks operate on an alternate-on basis so that only one of the two switches are on at a time.

17. A switching power converter incorporating a snubber network of claim 9 and having a power source connected in series with a controllable switch and the primary windings of an isolation transformer, wherein the first and fourth terminals of said snubber network are connected across said power source, the second and third terminals are connected across said primary windings and the third and fourth terminals are connected between the said controllable switch.

18. A switching power converter including a first and a second snubber network each connected between a power source and a controllable switch and wherein each said snubber network comprises a first series connection, a second series connection and a third diode, wherein:

said first series connection comprises a first capacitor and a first diode, said second series connection comprises a second capacitor and a sub-series connection of an inductor and a second diode, said second series connection is connected to said first series connection by connecting the end of said second capacitor which is not connected to said sub-series connection to the junction connecting said first diode and said first capacitor of said first series connection; and said third diode is connected between a terminal of said power source and the junction at which said second capacitor connects with said sub-series connection;

said first snubber network further providing that said first capacitor is connected to the anode of said first diode;

the cathode of said second diode is connected to said second capacitor either directly or via said inductor; and the anode of said third diode is connected to said second capacitor said second snubber network further providing that said first capacitor is connected to the cathode of said first diode;

the anode of said second diode is connected to said second capacitor either directly or via said inductor; and the cathode of said third diode is connected to the junction between said second capacitor and said sub-series connection;

and wherein the said first and second snubber networks are connected in series across the power source of said power converter, wherein said power source is divided into two power sources by a potential divider and the controllable switches of said first and second snubber networks are operable on an alternate-on basis so that only one of the two switches is on at a time.

* * * * *